(12) United States Patent
Yue et al.

(10) Patent No.: US 6,834,009 B1
(45) Date of Patent: Dec. 21, 2004

(54) INTEGRATED CIRCUIT WITH A THREE TRANSISTOR REPROGRAMMABLE NONVOLATILE SWITCH FOR SELECTIVELY CONNECTING A SOURCE FOR A SIGNAL TO A CIRCUIT

(75) Inventors: Kai Man Yue, Yuen Long (HK); Bomy Chen, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/641,803

(22) Filed: Aug. 15, 2003

(51) Int. Cl.$^7$ .............................................. G11C 16/04
(52) U.S. Cl. ............................ 365/185.05; 365/185.18
(58) Field of Search ........................ 365/185.05, 185.18, 365/177; 257/316, 315

(56) References Cited

U.S. PATENT DOCUMENTS

| 5,029,130 A | | 7/1991 | Yeh |
| 5,510,730 A | * | 4/1996 | El Gamal et al. ............. 326/41 |
| 6,756,632 B1 | * | 6/2004 | Chen et al. ................. 257/316 |

* cited by examiner

*Primary Examiner*—Son T. Dinh
(74) *Attorney, Agent, or Firm*—Gray Cary Ware & Friedenrich LLP

(57) ABSTRACT

A nonvolatile reprogrammable switch for use in a PLD or FPGA has a nonvolatile memory cell connected to the gate of an MOS transistor with the terminals of the MOS transistor connected to the source of the signal and to the circuit. The nonvolatile memory cell is of a split gate type having a first region and a second region, with a channel therebetween. The cell has a floating gate positioned over a first portion of the channel, which is adjacent to the first region and a control gate positioned over a second portion of the channel, which is adjacent to the second region. The second region is connected to the gate of the MOS transistor. The cell is programmed by injecting electrons from the channel onto the floating gate by hot electron injection mechanism. The cell is erased by Fowler-Nordheim tunneling of the electrons from the floating gate to the control gate. As a result, no high voltage is ever applied to the second region during program or erase. In addition a MOS FET transistor connects the gate of the MOS transistor to a voltage when the non-volatile memory cell is turned off. The floating gate of the non-volatile memory cell is connected to the gate of the MOS FET transistor.

15 Claims, 4 Drawing Sheets

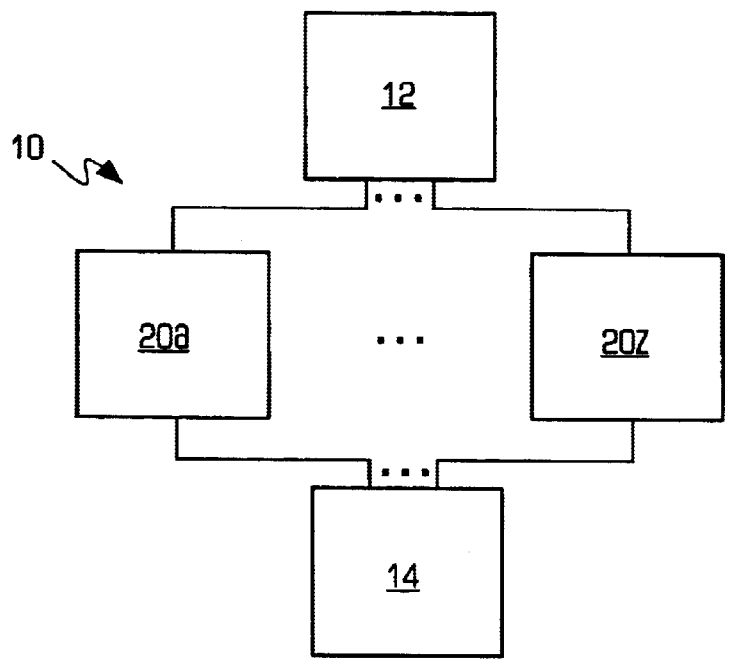
FIG. 1
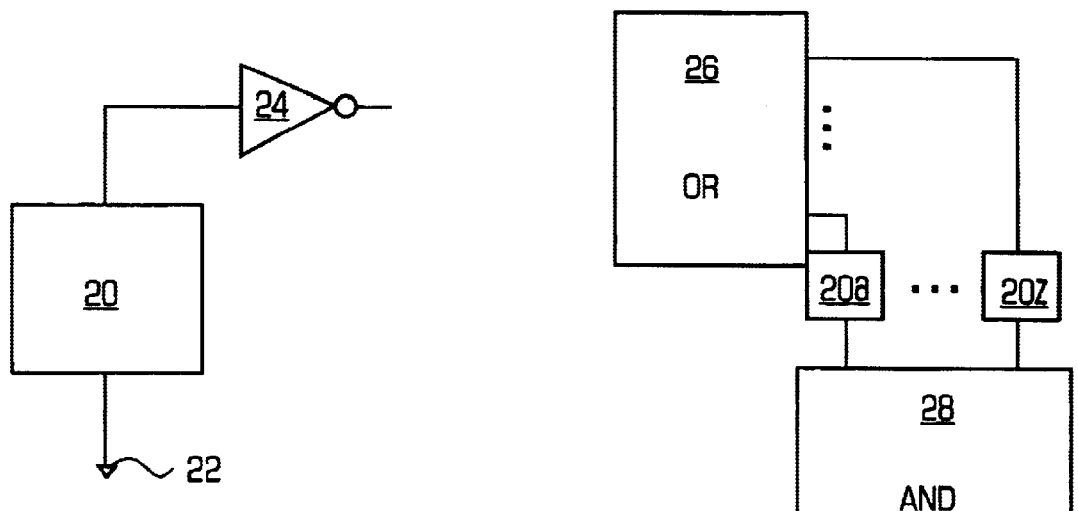
FIG. 2a
FIG. 2b

INTEGRATED CIRCUIT WITH A THREE TRANSISTOR REPROGRAMMABLE NONVOLATILE SWITCH FOR SELECTIVELY CONNECTING A SOURCE FOR A SIGNAL TO A CIRCUIT

TECHNICAL FIELD

The present invention relates to an integrated circuit, such as a Programmable Logic Device (PLD) or a Field Programmable Gate Array (FPGA) where there is a source for a signal and a circuit and a nonvolatile reprogrammable switch comprising three transistors for selectively connecting the source to the circuit. The present invention also relates to a simplified nonvolatile reprogrammable switch.

BACKGROUND OF THE INVENTION

PLDs or FPGAs are well-known in the art. Each type of device comprises a source for generating a signal and a circuit with a switch, such as an FET transistor, for selectively connecting the source to the circuit. Thus, the integrated circuit comprising of a PLD or an FPGA can be "configured" to the user's needs. This configuration can be done "on the fly" in which the switch must be reconfigured every time the device is used. Alternatively, the configuration can be "permanent" such as through the use of fuses and the like and the selective connection is made "permanent." Finally, this connection can also be reprogrammable using a nonvolatile memory cell as the storage element for controlling the FET transistor.

Heretofore, a nonvolatile memory cell, such as a cell using a floating gate to store charges in a stack gate configuration or in a split gate configuration is well-known in the art. However, in a typical nonvolatile memory cell, that is based upon a floating gate for storing of charges and with the charges stored on the floating gate controlling the conduction of current flow in a channel, the nonvolatile memory cell has a first region, and a spaced apart second region with a channel therebetween. The floating gate is positioned over and spaced apart from a portion of the channel for controlling the conduction of the charges in the channel. Heretofore, with the exception of the nonvolatile memory cell disclosed in U.S. Pat. No. 5,029,130, which is assigned to the present assignee and whose disclosure is incorporated herein in its entirety by reference, all of the other prior art nonvolatile memory cells require the use of a high voltage applied to one of the first region or the second region for programming, and applied to the other of the first region or the second region for erase. As a result, because high voltage must be applied to both the first region and to the second region during the erase operation and the programming operation, a nonvolatile memory cell used as a part of a reprogrammable nonvolatile memory switch has required the use of another transistor to separate the nonvolatile memory cell from the FET transistor. This addition of another transistor interposed between the nonvolatile memory cell and the FET transistor causes wastage in real estate in the silicon in that if a integrated circuit device has many interconnections requiring many reprogrammable nonvolatile memory switches, many excess transistors need to be used.

In U.S. Pat. No. 5,029,130, a nonvolatile memory cell is disclosed having a first region and a spaced apart second region with a channel therebetween. A floating gate is positioned over and spaced apart from a first portion of a channel which is adjacent to the first region. A control gate is positioned over and spaced apart from a second portion of the channel which is adjacent to the second region. In programming, the first region is supplied with a high positive voltage to attract electrons from the second region which are injected through the mechanism of hot electron injection onto the floating gate. During erase, the control gate is held at a "high" positive potential to attract electrons from the floating gate to Fowler-Nordheim tunnel through the insulation separating the control gate from the floating gate. The first and second regions can be held at ground or at floating.

SUMMARY OF THE INVENTION

An integrated circuit has a source for a signal and a circuit with a reprogrammable nonvolatile switch for selectively connecting the source for the signal to the circuit. The reprogrammable nonvolatile switch comprises a MOS transistor with a first terminal and a spaced apart second terminal and a channel in between the first terminal and the second terminal. A tunneling insulating layer is over the channel with a gate on the tunneling insulating layer and on the channel. The first terminal is connected to the source and the second terminal is connected to the circuit. A nonvolatile memory cell has a first region and a spaced apart second region with a channel therebetween. The first and second regions are of a first conductivity type with the channel being a second conductivity type. A first insulating layer is over the channel. A floating gate is on the first insulating layer and is spaced apart from a first portion of the channel. The first portion of the channel is adjacent to the first region. A control gate is on the first insulating layer and is spaced apart from a second portion of the channel. The second portion of the channel is adjacent to the second region. A second insulating layer is between the floating gate and the control gate. An FET transistor has a first terminal and a spaced apart second terminal with a channel therebetween. The first and second terminals of the FET transistor are of a second conductivity type with a channel being of the first conductivity type. A gate controls the flow of current between the first terminal and the second terminal. The gate of the FET transistor is connected to the floating gate. The first terminal is connected to a voltage source and the second terminal is connected to the second region of the nonvolatile memory cell. The gate of the MOS transistor is connected to the second region of the nonvolatile memory cell. The first insulating layer permits the injection of charges from the channel onto the floating gate. The second insulating layer permits the Fowler-Nordheim tunneling of electrons between the floating gate and the control gate.

BRIEF DESCRIPTION OF THE DRAWINGS

FIG. 1 is a block level diagram of an integrated circuit of the present invention showing a source for a signal and a circuit with a plurality of reprogrammable nonvolatile switches for selectively connecting the source to the circuit.

FIG. 2A is a circuit diagram of a detailed example of one use of the reprogrammable nonvolatile switch of the present invention for connecting a voltage source such as ground to a logic circuit, such as an inverter.

FIG. 2B is a detailed circuit diagram showing the use of the reprogrammable nonvolatile switch of the present invention for use in connecting a plane of OR gates to a plane of AND gates wherein the output of the OR gates is a plurality of logic signals with the array of AND gates selectively connected to the output signals from the array of OR gates.

DETAILED DESCRIPTION OF THE INVENTION

Figure 3A:
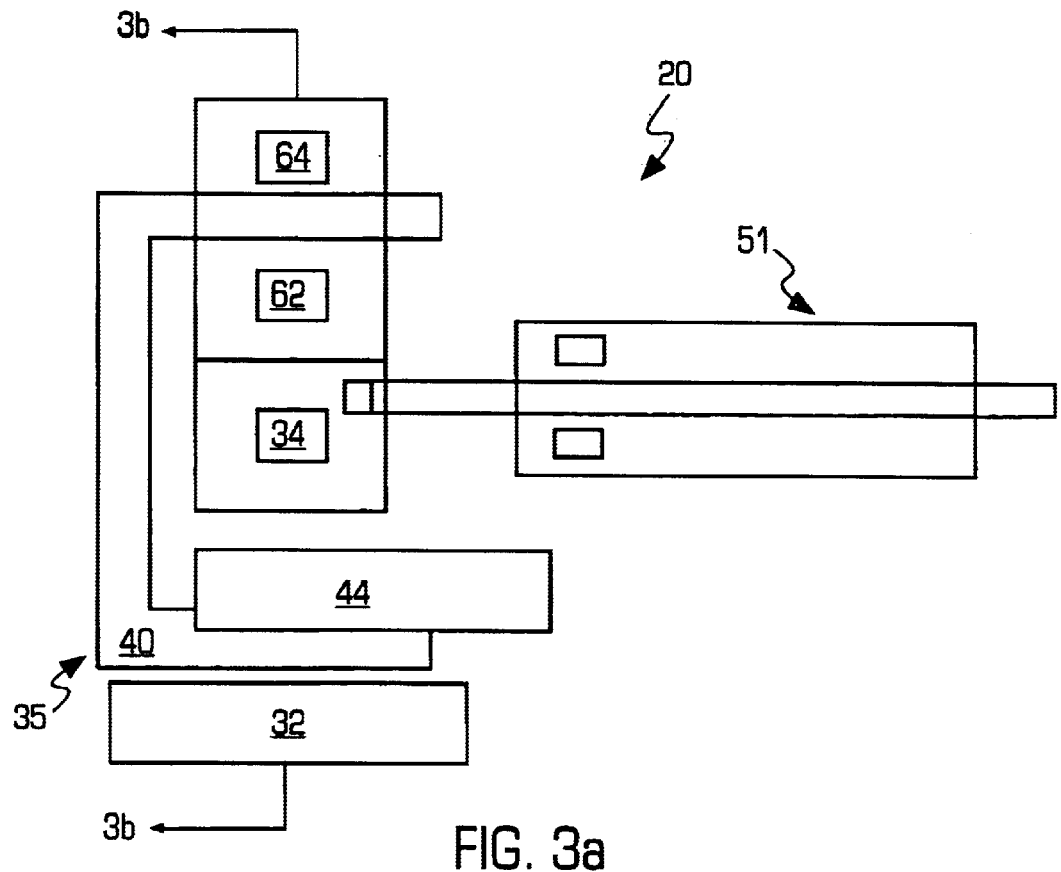
FIG. 3A is a top view of one embodiment of the reprogrammable non-volatile switch of the present invention.

Referring to FIG. 1 there is shown a block level diagram of an integrated circuit 10 of the present invention. The integrated circuit 10 comprises a source 12 for a signal. As will be shown, as discussed hereinafter, the source 12 can be a voltage source such as ground or $V_{SS}$ or $V_{DD}$ or it can be a source of a logic signal or even an analog signal. As shown in FIG. 1, the source 12 generates a plurality of signals. The integrated circuit 10 also comprises a circuit 14. Again, as will be shown, the integrated circuit 14 can comprise any type of circuit element, such as logic circuit or analog circuit, to process each of the signals from the source 12. Finally, the integrated circuit 10 comprises a plurality of reprogrammable nonvolatile switches 20(a–z). Each reprogrammable nonvolatile switches 20(a–z) selectively connects one of the signals from the source 12 to the circuit 14.

Referring to FIG. 2A there is shown a circuit diagram of one example of the usage of the reprogrammable nonvolatile switch 20 of the present invention for use in an integrated circuit. The reprogrammable nonvolatile switch 20 connects ground voltage or $V_{SS}$ (it could also be $V_{DD}$ or any other voltage) to an inverter circuit 24. As can be seen, if the switch 20 connects the input of the inverter 24 to ground voltage 22, then the output of the inverter 24 is a high voltage. On the other hand, if the switch 20 were in an open position not connecting the input of the inverter 24 to ground 22, then the output of the inverter 24 is an indeterminate or floating signal.

Referring to FIG. 2B there is shown another example of the usage of the reprogrammable nonvolatile switch 20 of the present invention. In this case, the integrated circuit is a PLD which comprises of a plane of OR gates 26 which has a plurality of outputs, each of which is connected to the switch 20 and to the input of a plane of AND gates 28. If a switch 20 were open, then there is no connection between the output of the particular OR gate 26 to the input of the particular AND gate 28. However, if the switch 20 were closed, then the output of the particular OR gate 26 would connect to the input of the particular AND gate 28. Since there is an array of OR gates 26 and an array of AND gates 28, a plurality of switches 20(a–z) are shown.

Further, the switch 20 of the present invention can interconnect different circuits within an FPGA integrated circuit, or any other integrated circuit in which a signal from one portion of the integrated circuit can be selectively connected and reprogrammed to another portion of the circuit in the integrated circuit.

Figure 3B:
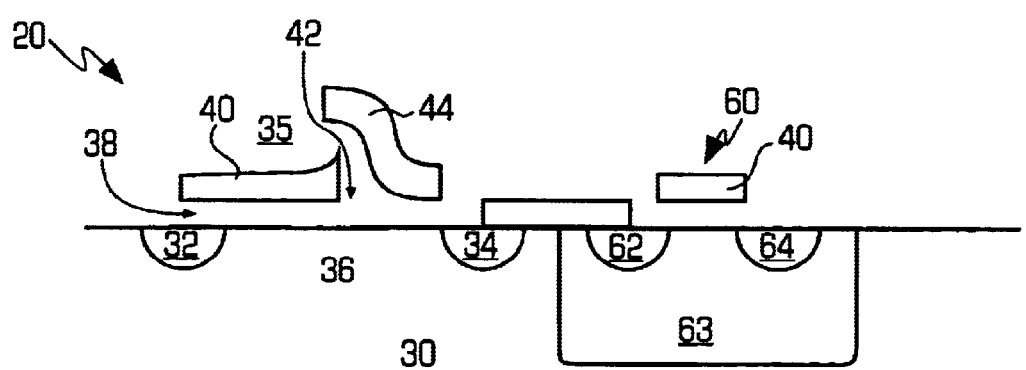
FIG. 3B is a cross-sectional view of the embodiment of the reprogrammable non-volatile switch shown in FIG. 3A.

Referring to FIG. 3A there is shown a top view of one embodiment of the reprogrammable nonvolatile switch 20 of the present invention. The switch 20 is a part of an integrated circuit, similar to that shown and described in FIGS. 1, 2A and 2B. Thus, there is a substrate 30 of a semiconductive material, shown in FIG. 3b. However, as is well-known to those skilled in the art, the term "substrate" can also include a well within a substrate. Typically, the substrate 30 is a P type material, although it can also be N type. The switch 20 comprises a nonvolatile memory cell 35 of the type shown and described in U.S. Pat. No. 5,029,130, which as previously discussed, whose disclosure is incorporated herein by reference in its entirety. The cell 35 has a first region 32 separated from a second region 34, with a channel region 36 therebetween, all in the substrate 30. In the preferred embodiment, if the substrate is P type conductivity, then the first and second regions 32 and 34 are of N type and the channel 36 is also P-type. A first insulating layer 38 is over the channel 36. A floating gate 40 is on the first insulating layer 38 and is over a first portion of the channel 36. The first portion of the channel 36 is adjacent to the first region 32. A control gate 44 is on the first layer 38 and is over a second portion of the channel 36. The second portion of the channel 36 is adjacent to the second region 34. The control gate 44 is separated and spaced apart from the floating gate 40 by a second insulating layer 42. As disclosed in U.S. Pat. No. 5,029,130, the mechanism for programming, erasure and reading is as follows.

To program the cell 35, a positive high voltage such as +12 volts is applied to the first region 32. The second region 34 is held substantially at or near ground. The floating gate 40 is capacitively coupled to the first region 32. If +12 volts is applied to the first region 32, then the floating gate 40 would have approximately +8 volts thereon. A low voltage of approximately +2 volts is applied to the control gate 44, thereby turning on the second portion of the channel 36 beneath the control gate 44. As a result, electrons from the second region 34 are accelerated towards the first region 32. However, at a junction between the second portion of the channel 36 and the first portion of the channel 36, the electrons experience an increase in voltage attraction to the floating gate 40 and are injected through the hot electron injection mechanism onto the floating gate 40. Therefore, when the cell 35 is programmed, electrons are injected on the floating gate 40 and the presence of the electrons on the floating gate 40 affect the conduction of electrons in the channel 36. To erase the cell 35, a high potential such as +12 volts is applied to the control gate 44. The first and second regions 32 and 34 can be held at ground or floating. Electrons from the floating gate 40 are attracted by the high positive potential at the control gate 44 and through the mechanism of Fowler-Nordheim tunneling, they tunnel through the second insulating layer 42 separating the control gate 44 from the floating gate 40. To read the cell 35, a positive voltage such as $V_{DD}$ is placed at the first region 32 and $V_{SS}$ is at the second region 34, with a positive voltage placed on the control gate 44. If the floating gate 40 is erased, then it is positively charged and therefore the channel 36 between the first and second regions 32 and 34 would conduct. However, if the floating gate 40 is programmed, and since it is negatively charged, the first portion of the channel 36 would not conduct and there would not be any current flow between the first and second regions 32 and 34.

The reprogrammable nonvolatile switch also comprises a MOS transistor 51. As will be seen, the MOS transistor 51 can be P type or N type. The MOS transistor 51 comprises a first region 50 and a second region 52 with a channel 54 therebetween. The first region 50, the second region 52 and the channel 54 are in the substrate 30 or can be in a well. Above the channel 54 is a tunneling insulating layer 56. Typically, the insulating layer 56 is approximately 20 angstroms thick or less. A gate 58, such as polysilicon, is positioned on the tunneling insulating layer 56 and is above the channel 54 and serves to control the conduction of charges between the first and second regions 50 and 52. Finally, the gate 58 of the MOS transistor 51 is connected to the second region 34 of the cell 35. The reprogrammable non-volatile switch also comprises an FET transistor 60. The FET transistor 60 comprises a first region 62 and a second region 64 spaced apart therefrom. The region 62 and 64 are of a conductivity type which is opposite to the conductivity type of the regions 32 and 34 of the non-volatile memory cell 35. Thus, typically, the FET transistor 60 is formed in a well 63. The FET transistor 60 also comprises a gate 40 which overlies the channel between the regions 62 and 64 and controls the conduction of current flow therebetween. The gate 40 is an extension of the floating gate 40 of the non-volatile memory cell 35.

Figure 4A:
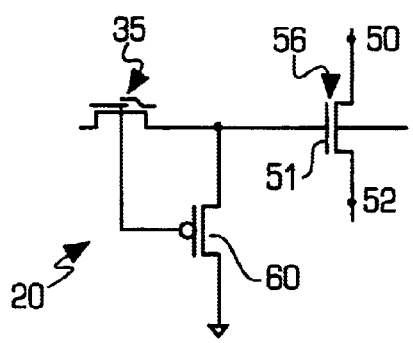
FIGS. 4A–4D are circuit diagrams of various embodiments of the reprogrammable non-volatile switch of the present invention, in which the channel of the non-volatile memory cell is of a first conductivity type.

One embodiment of the reprogrammable non-volatile switch 20 of the present invention is shown in FIG. 4A. In the embodiment shown in FIG. 4A, the first and second regions 32 and 34 of the non-volatile memory cell 35 are of N conductivity type. Similarly the first and second regions 50 and 52 of the MOS transistor 51 are also of N conductivity type. Finally, the first and second regions 62 and 64 of the FET transistor 60 are of P type. The second region 64 of the FET transistor 60 is connected to ground or VSS.

In the operation of the reprogrammable non-volatile switch 20 of the embodiment shown in FIG. 4A, to program the switch 20 the first and second regions 50 and 52 of the MOS transistor 51 are connected to ground. A positive voltage such as +12 volts is supplied to the first region 32 of the cell 35. A positive voltage such as +2 volts is supplied to the control gate 44. Electrons tunnel through the tunneling insulating layer 56 onto the gate 58 of the MOS transistor 51. Electrons then traverse to the second region 34 of the non-volatile memory cell 35. With the second region 34 at substantially ground, electrons from the second region 34 are accelerated to the first region 32 and through the mechanism of hot electron injection are injected onto the floating gate 40. An alternative mechanism to programming the cell 35 can occur by having the substrate tied to ground during programming. In that event, electrons from the substrate are tunneled through the tunneling insulating layer 56 onto the gate 58 of the MOS transistor 51. The electrons will then flow to the second region 34 and be programmed onto the floating gate 40 all as previously described.

The reprogrammable non-volatile switch 20 is erased by placing a high voltage such as +12 volts to the control gate 44 and with the first and second regions 32 and 34 either floating or tied to ground. Electrons from the floating gate 40 are attracted to the control gate 44 and through the mechanism of Fowler-Nordheim tunneling, they are removed from the floating gate 40 and the floating gate 40 becomes positively charged.

To operate the non-volatile switch 20, once it has been programmed or erased, an operating voltage such as +3.3 volts is supplied to the first region 32 of the cell 35. A positive voltage, such as +2 volts, is supplied to the control gate 44. If the floating gate 40 is erased, then the voltage +3.3 volts supplied to the first region 32 passes through the channel 36 onto the second region 34. At the same time, if the floating gate is erased, and is therefore positively charged, then the PMOS FET transistor 60 is turned off. Thus, +3.3 volts appears at the second region 34 where it is applied to the gate 58 of the MOS transistor 51. Since the MOS transistor 51 is an NMOS FET, the MOS transistor 51 is turned on by a positive voltage such as +3.3 volts. This then causes the signal from the source 12 to be supplied to the circuit 14. However, if the floating gate 40 of the cell 35 is programmed, then the electrons on the floating gate 40 would inhibit the flow of current in the channel 36 between the first region 32 and the second region 34 of the cell 35. With the floating gate 40 being charged with electrons, the PMOS FET 60 is turned on, thereby connecting the Vss to the second region 34. This would cause approximately Vss or ground voltage to be supplied to the gate 58 of the NMOS transistor 51, which would turn it off. This would disconnect the source 12 from the circuit 14.

Figure 4B:
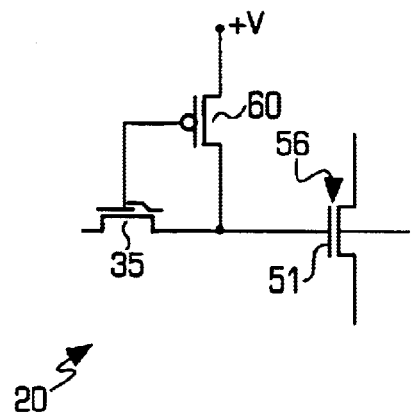

Referring to FIG. 4B, there is shown a second embodiment of the reprogrammable non-volatile switch 20 of the present invention. The embodiment shown in FIG. 4B is identical to the embodiment shown in FIG. 4A except that the second region 64 of the FET transistor 60 is connected to Vdd or a source of positive voltage, such as +3.3 volts. The mechanism of programming electrons onto the floating gate 40 through the tunneling insulating layer 56 from either the substrate 30 or from either of the regions 62 to 64 is identical to the programming mechanism described for the embodiment shown in FIG. 4A. Similarly, the erase mechanism for removal of the electrons from the floating gate 40 is identical to the mechanism described for the embodiment shown in FIG. 4A.

In the operation of the reprogrammable non-volatile switch 20 shown in FIG. 4B, an operating voltage such as Vss or ground is supplied to the first region 32 of the cell 35. A positive voltage such as +2 volts is supplied to the control gate 44. If the floating gate 40 is erased, then it is positively charged. This would cause the voltage supplied to the first region 32 to be passed through the channel 36 onto the second region 34. With a positive voltage, the PMOS transistor 60 is turned off. Thus, Vss would be applied to the gate 58 of the MOS transistor 51, thereby disconnecting the source 12 from the circuit 14. If the floating gate 40 were programmed, then electrons on the floating gate 40 would prevent the voltage applied to the first region 32 to pass through the channel 36 and to the second region 34. However, the negatively charged floating gate 40 would turn on the PMOS FET transistor 60 thereby supplying a positive voltage such as Vdd to the second region 34. This would turn on the MOS transistor 51 connecting the source 12 to the circuit 14.

Figure 4C:
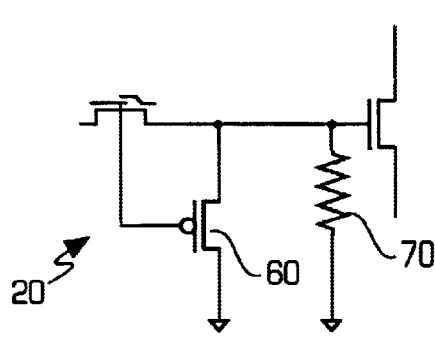

Referring to FIG. 4C, there is shown another embodiment of the reprogrammable non-volatile switch 20 of the present invention. The embodiment shown in FIG. 4C is identical to the embodiment shown in FIG. 4A except for the addition of a polysilicon resistor 70 connecting the second region 34 of the cell 35 to ground. Because of the addition of the polysilicon resistor 70, during programming, the electrons can flow from ground through the resistor 70 to the second region 34 of the cell 35 and then be injected onto the floating gate 40. Thus, the tunneling insulating layer 56 of the MOS transistor 51 need not be so thin as to accommodate the tunneling of electrons therethrough. The mechanism of erase is identical to the mechanism of erase described for the embodiment shown and described in FIG. 4A. Finally, the operation of the switch 20 shown FIG. 4C is also identical to the operation of the switch 20 shown and described in FIG. 4A.

Figure 4D:
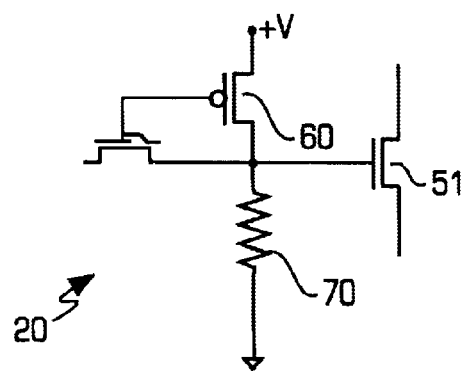

Referring to FIG. 4D, there is shown another embodiment of the reprogrammable non-volatile switch 20 of the present invention. The embodiment shown in FIG. 4D is identical to the embodiment shown in FIG. 4B except for the addition of a polysilicon resistor 70 connecting the second region 34 of the cell 35 to ground. Because of the addition of the polysilicon resistor 70, during programming, the electrons can flow from ground through the resistor 70 to the second region 34 of the cell 35 and then be injected onto the floating gate 40. Thus, the tunneling insulating layer 56 of the MOS transistor 51 need not be so thin as to accommodate the tunneling of electrons therethrough. The mechanism of erase is identical to the mechanism of erase described for the embodiment shown and described in FIG. 4B. Finally, the operation of the switch 20 shown FIG. 4D is also identical to the operation of the switch 20 shown and described in FIG. 4B.

Figure 5A:
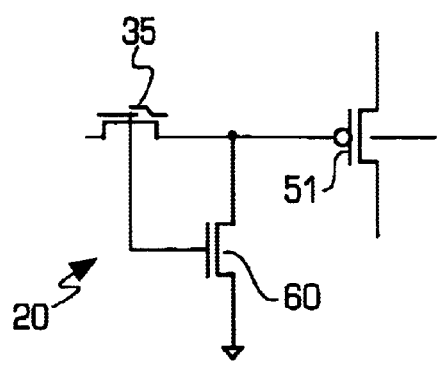
FIGS. 5A–5D are circuit diagrams of various embodiments of the reprogrammable non-volatile switch of the present invention, in which the channel of the non-volatile memory cell is of a second conductivity type.

Referring to FIG. 5A, there is shown another embodiment of the reprogrammable non-volatile switch 20 of the present invention. The switch 20 comprises a non-volatile memory cell 35 all as shown as previously described. However, the first and second regions 32 and 34 are of the P conductivity type. Thus, the charges that traverse through the channel 36 of the cell 35 are "holes" rather than electrons. In addition, the MOS transistor 51 is also of P conductivity type. Thus the first and second regions 50 and 52 of the MOS transistor 51 are also of P conductivity type. Finally, the FET 60 is of N conductivity type. Thus, the first and second regions 62 and 64 of the NMOS FET 60 are of N conductivity type. The cell 35, the MOS transistor 51 and the FET 60 are all connected in the same arrangement as shown and described for the embodiment shown in FIG. 4A. The second region 64 of the NMOS FET 60 is connected to Vss or ground.

In the operation of the reprogrammable non-volatile switch 20 of the embodiment shown in FIG. 5A, the first and second regions 50 and 52 of the PMOS transistor 51 is connected to ground or Vss. The first region 32 of the cell 35 is connected to a source of negative voltage such as –12 volts. A low negative voltage, such as –2 volts is supplied to the control gate 44. Holes from the first and second regions 50 and 52 of the MOS transistor 51, tunnel through the tunneling insulating layer 56 onto the second region 34 of the cell 35 and traverse into channel 36 and are attracted to the first region 32. They accelerate and are injected onto the floating gate 40. To erase the cell 35, the control gate 44 is connected to a source of negative voltage and electrons from the control gate 44 tunnel through the second insulating layer 42 onto the floating gate 40 to "neutralize" the holes. Alternative, the substrate 30 can be connected to Vss or ground and the holes are then tunneled through the tunneling insulating layer 56 to the gate 58.

In operation, a positive voltage such as Vdd or +3.3 volts is supplied to the first region 32. If the floating gate 40 were positively charged, i.e., with holes injected through the first insulating layer 38 onto the floating gate 40, then since this is P type device, the voltage at the first region 32 would not pass through the channel 36 onto the second region 34. In that event, the positive voltage on the floating gate 40 would turn on the NMOS FET 60, thereby connecting the second region 34 of the cell 35 to Vss or to ground. However, since the MOS transistor 51 is a P type, this would turn on the PMOS transistor 51 thereby connecting the source to the circuit 14. If the cell 35 were erased, then the negative charges on the floating gate 40 would turn on the channel 36. The positive voltage supplied to the first region 32 would pass through the channel 36 and be present at the second region 34. The positive voltage is then supplied to the gate 58 of the PMOS transistor 51, thereby turning it off and disconnecting the source 12 from the circuit 14.

Figure 5B:
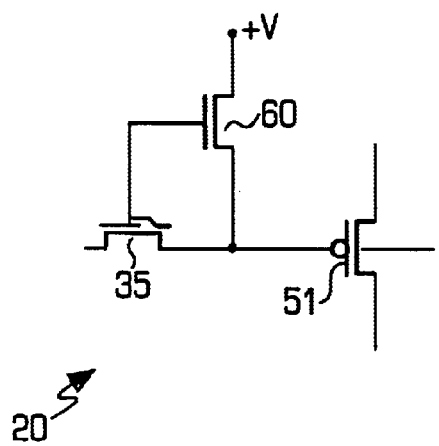

Referring to FIG. 5B, there is shown yet another embodiment of the reprogrammable non-volatile switch 20 of the present invention. The embodiment shown in FIG. 5B is identical to the embodiment shown in FIG. 5A except that the second region 64 of the NMOS FET 60 is connected to a source of positive voltage, such as VDD or +3.3 volts. The mechanism of programming is identical to the mechanism of programming for the embodiment shown in FIG. 5A in that holes are tunneled through the tunneling insulating layer 56 onto the gate 58 and to the second region 34 where they are accelerated and injected onto the floating gate 40. The mechanism for erasure is the same as the mechanism shown as described for the embodiment shown in FIG. 5A in that electrons from the control gate 44 tunnel through the second insulating layer 42 of the cell 35 and onto the floating gate 40 to "neutralize" the holes therein.

In the operation of the reprogrammable non-volatile switch 20 of the embodiment shown in FIG. 5B, a low positive voltage or ground, such as Vss is applied to the first region 32. If the floating gate 40 were positively charged, the channel 36 would be turned off. However, this would turn on the NMOS FET 60 thereby connecting the second region 34 of the cell 35 and the gate 58 of the PMOS transistor 60 to a source of positive voltage. Since the MOS transistor 51 is of the P type, it would be turned off thereby disconnecting the source 12 from the circuit 14. If the floating gate 40 were erased, then the negatively charged floating gate 40 would inhibit the NMOS FET 60 from turning on. However, the negatively charged floating gate 40 would turn on the channel 36 thereby transferring the low voltage or ground from the first region 32 to the second region 34 and onto the gate of the PMOS transistor 51, thereby turning it on to connect the source 12 to the circuit 14.

Figure 5C:
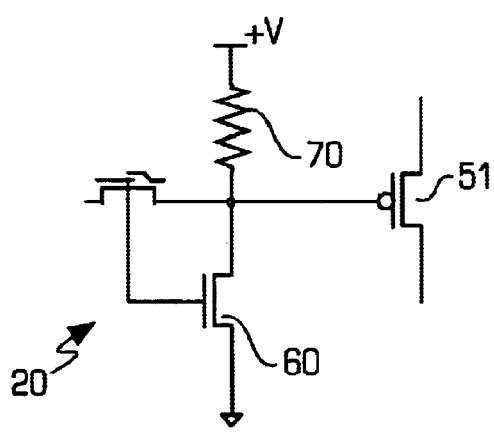

Referring to FIG. 5C, there is shown another embodiment of the reprogrammable non-volatile switch 20 of the present invention. The embodiment shown in FIG. 5C is identical to the embodiment shown in FIG. 5A except for the addition of a polysilicon resistor 70 connecting the second region 34 of the cell 35 to Vdd, or a positive voltage, such as +3.3 volts. Because of the addition of the polysilicon resistor 70, during programming, the holes can flow from Vdd through the resistor 70 to the second region 34 of the cell 35 and then be injected onto the floating gate 40. Thus, the tunneling insulating layer 56 of the PMOS transistor 51 need not be so thin as to accommodate the tunneling of holes therethrough. The mechanism of erase is identical to the mechanism of erase described for the embodiment shown and described in FIG. 5A. Finally, the operation of the switch 20 shown FIG. 5C is also identical to the operation of the switch 20 shown and described in FIG. 5A.

Figure 5D:
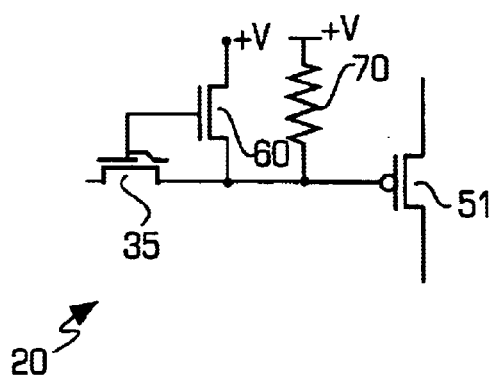

Referring to FIG. 5D, there is shown another embodiment of the reprogrammable non-volatile switch 20 of the present invention. The embodiment shown in FIG. 5D is identical to the embodiment shown in FIG. 5B except for the addition of a polysilicon resistor 70 connecting the second region 34 of the cell 35 to Vdd or a positive voltage, such as +3.3 volts. Because of the addition of the polysilicon resistor 70, during programming, the holes can flow from +3.3 volts through the resistor 70 to the second region 34 of the cell 35 and then be injected onto the floating gate 40. Thus, the tunneling insulating layer 56 of the PMOS transistor 51 need not be so thin as to accommodate the tunneling of holes therethrough. The mechanism of erase is identical to the mechanism of erase described for the embodiment shown and described in FIG. 5B. Finally, the operation of the switch 20 shown FIG. 5D is also identical to the operation of the switch 20 shown and described in FIG. 5B.

From the foregoing, it can be seen that the principles of operation for the switch 20 shown in the embodiments in FIGS. 5A–5D are the same as that for the switch 20 shown in FIGS. 4A–4D except that charges for the electrons are replaced by holes.

What is claimed is:

1. An integrated circuit comprising:
a source for a signal;
a circuit;
a reprogrammable non-volatile switch for selectively connecting said source to said circuit, said switch comprising:
a MOS transistor having a first terminal and a spaced apart second terminal with a channel between said first terminal and said second terminal; a tunneling insulating layer over said channel, and a gate on said tunneling insulating layer and on said channel; said first terminal is connected to said source, and said second terminal is connected to said circuit;
a non-volatile memory cell having a first region and a spaced apart second region with a channel therebetween, said first and said second regions being of a first conductivity type with said channel being of a second conductivity type; a first insulating layer over said channel; a floating gate on said first insulating layer and spaced apart from a first portion of said channel, wherein said first portion of said channel is adjacent to said first region; a control gate on said first insulating layer and spaced apart from a second portion of said channel; wherein said second portion of said channel is adjacent to said second region; and a second insulating layer between said floating gate and said control gate; wherein said first insulating layer permits the injection of charges from said channel onto said floating gate, and said second insulating layer permits the Fowler-Nordheim tunneling of electrons between said floating gate and said control gate;
said gate of said MOS transistor connected to said second region of said non-volatile memory cell;
an FET transistor having a first terminal and a spaced apart second terminal, with a channel therebetween, said first and said second terminals being of a second conductivity type with said channel being of said first conductivity type; and a gate controlling the flow of current between said first terminal and said second terminal; said gate of said FET transistor connected to said floating gate, said first terminal connected to a voltage source, and said second terminal connected to said second region of said non-volatile memory cell;
wherein said MOS transistor is connectable to a first voltage, said control gate is connectable to a second voltage, and said first region is connectable to a third voltage permitting charges to tunnel through said tunneling insulating layer of said MOS transistor to said second region, into said channel of said non-volatile memory cell, and being injected onto said floating gate for programming;
wherein said control gate is connectable to a fourth voltage for removal of charges from said floating gate; and
wherein said first region is connectable to a fifth voltage to control the connection of said source to said circuit depending upon the state of said floating gate.

2. The integrated circuit of claim 1 wherein said charges are holes.

3. The integrated circuit of claim 1 wherein said charges are electrons.

4. The integrated circuit of claim 3 wherein said source for a signal is a voltage source.

5. The integrated circuit of claim 3 wherein said source for a signal is a first circuit, and wherein said circuit is a second circuit.

6. The integrated circuit of claim 5 wherein said first circuit is a first logic circuit, and wherein said second circuit is a second logic circuit.

7. The integrated circuit of claim 5 wherein said integrated circuit is a FPGA.

8. The integrated circuit of claim 3 wherein said first voltage is ground.

9. The integrated circuit of claim 8 wherein said first and second terminals of said MOS transistor are connected to ground.

10. The integrated circuit of claim 8 wherein said MOS transistor has a substrate and wherein said substrate is connected to ground.

11. The integrated circuit of claim 3 wherein said first region of said non-volatile memory cell is capacitively coupled to said floating gate, and wherein said third voltage is a positive voltage sufficient to cause said electrons in said channel of said non-volatile memory cell to be injected onto said floating gate.

12. The integrated circuit of claim 1 wherein said first conductivity type is P type and said second conductivity type is N type.

13. The integrated circuit of claim 1 wherein said first conductivity type is N type and said second conductivity type is P type.

14. The integrated circuit of claim 13 wherein said MOS transistor is a NMOS transistor.

15. An integrated circuit comprising:
a source for a signal;
a circuit;
a reprogrammable non-volatile switch for selectively connecting said source to said circuit, said switch comprising:
a MOS transistor having a first terminal and a spaced apart second terminal with a channel between said first terminal and said second terminal; a gate spaced apart from said channel, said first terminal is connected to said source, and said second terminal is connected to said circuit;
a non-volatile memory cell having a first region and a spaced apart second region with a channel therebetween, said first and said second regions being of a first conductivity type with said channel being of a second conductivity type; a first insulating layer over said channel; a floating gate on said first insulating layer and spaced apart from a first portion of said channel, wherein said first portion of said channel is adjacent to said first region; a control gate on said first insulating layer and spaced apart from a second portion of said channel; wherein said second portion of said channel is adjacent to said second region; and a second insulating layer between said floating gate and said control gate; wherein said first insulating layer permits the injection of charges from said channel onto said floating gate, and said second insulating layer permits the Fowler-Nordheim tunneling of electrons between said floating gate and said control gate;
said gate of said MOS transistor connected to said second region of said non-volatile memory cell;
an FET transistor having a first terminal and a spaced apart second terminal, with a channel therebetween, said first and said second terminals being of a second conductivity type with said channel being of said first conductivity type; and a gate controlling the flow of current between said first terminal and said second terminal; said gate of said FET transistor connected to said floating gate, said first terminal connected to a voltage source, and said second terminal connected to said second region of said non-volatile memory cell;

a polysilicon resistor having a first end and a second end, with said first end connected to said second region of said non-volatile memory cell, and said first end connected to a first voltage source;

wherein said control gate is connectable to a second voltage, and said first region is connectable to a third voltage permitting charges to traverse from said first end to said second region into said channel of said non-volatile memory cell, and being injected onto said floating gate for programming;

wherein said control gate is connectable to a fourth voltage for removal of charges from said floating gate; and wherein said first region is connectable to a fifth voltage to control the connection of said source to said circuit depending upon the state of said floating gate.

* * * * *